(12) United States Patent
Shoham et al.

(10) Patent No.: US 11,194,475 B2
(45) Date of Patent: Dec. 7, 2021

(54) COORDINATED UPDATING AND SEARCHING A CONTENT-ADDRESSABLE MEMORY INCLUDING FOR PACKET PROCESSING OPERATIONS

(71) Applicant: Cisco Technology, Inc., San Jose, CA (US)

(72) Inventors: Doron Shoham, Shoham (IL); Gilad Hazan, Shoham (IL)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 15/954,518

(22) Filed: Apr. 16, 2018

(65) Prior Publication Data

US 2019/0317671 A1    Oct. 17, 2019

(51) Int. Cl.
    *G06F 3/06*    (2006.01)
    *G11C 15/00*    (2006.01)
    *H04L 12/70*    (2013.01)

(52) U.S. Cl.
CPC .......... *G06F 3/0613* (2013.01); *G06F 3/0646* (2013.01); *G06F 3/0685* (2013.01); *G11C 15/00* (2013.01); *H04L 2012/5638* (2013.01)

(58) Field of Classification Search
CPC .... G06F 3/0613; G06F 3/0685; G06F 3/0646; G11C 15/00; H04L 45/745
See application file for complete search history.

(56) References Cited

U.S. PATENT DOCUMENTS

| | | |
|---|---|---|
| 6,374,326 B1 | 4/2002 | Kansal et al. |
| 6,389,506 B1 | 5/2002 | Ross et al. |
| 6,526,474 B1 | 2/2003 | Ross |
| 6,535,951 B1 | 3/2003 | Ross |
| 6,606,681 B1 | 8/2003 | Uzun |

(Continued)

OTHER PUBLICATIONS

McAuley et al., "Fast Routing Table Lookup Using CAMs", Mar. 28, 2004-Apr. 1, 1993, IEEE, pp. 1382-1391. (Year: 1993).*

(Continued)

*Primary Examiner* — Masud K Khan
(74) *Attorney, Agent, or Firm* — The Law Office Of Kirk D. Williams

(57) ABSTRACT

In one embodiment, updating and searching of entries in a hardware content-addressable memory is coordinated to provide more searching bandwidth (e.g., for determining packet processing information), including, but not limited to, when vectors are moved among entries to free up desired entry positions for insertion of other vectors. A lookup operation is performed in content-addressable memory entries in a hardware content-addressable memory based on a lookup word to generate a content-addressable memory lookup result. Typically overlapping in time, a matching operation is performed in one or more transitory entries to generate a transitory matching result based on the lookup word. These transitory entries are populated with transitory vectors and have an associated index within the content-addressable memory, with these transitory vectors are subsequently inserted in the content-addressable memory at their associated index positions. A matching result is determined from the content-addressable memory lookup result and the transitory matching result.

10 Claims, 5 Drawing Sheets

(56) References Cited

U.S. PATENT DOCUMENTS

| | | | |
|---|---|---|---|
| 6,700,809 B1* | 3/2004 | Ng et al. | G11C 15/00 |
| | | | 365/49 |
| 6,715,029 B1 | 3/2004 | Trainin et al. | |
| 6,738,862 B1 | 5/2004 | Ross et al. | |
| 6,871,262 B1 | 3/2005 | Oren et al. | |
| 7,103,708 B2 | 9/2006 | Eatherton et al. | |
| 7,257,672 B2* | 8/2007 | Shoham | G06F 11/1064 |
| | | | 365/49.1 |
| 7,260,673 B1 | 8/2007 | Ross | |
| 7,290,083 B2 | 10/2007 | Shoham et al. | |
| 7,305,519 B1 | 12/2007 | Nagaraj | |
| 7,345,897 B2 | 3/2008 | Krishnan et al. | |
| 7,349,230 B2 | 3/2008 | Parthasarathy et al. | |
| 7,350,131 B2 | 3/2008 | Trainin | |
| 7,527,672 B2* | 5/2009 | Berger et al. | G06F 12/00 |
| | | | 711/108 |
| 8,887,026 B2 | 11/2014 | Bremler-Barr et al. | |
| 9,710,187 B1* | 7/2017 | Si et al. | G06F 3/065 |
| 2010/0005254 A1* | 1/2010 | Cooke | G11C 15/00 |
| | | | 711/156 |
| 2014/0032793 A1* | 1/2014 | Shen et al. | G06F 13/28 |
| | | | 710/26 |
| 2019/0007315 A1* | 1/2019 | Shoham | H04L 45/7457 |

OTHER PUBLICATIONS

Bremler-Barr et al., "PEDS: A Parallel Error Detection Scheme for TCAM Devices," IEEE/ACM Transactions on Networking, vol. 18, No. 5, Oct. 2010, IEEE, New York, New York (eleven pages).

Sidoros Sideris and Kiamal Pekmestzi, "Cost Effective Protection Techniques for TCAM Memory Arrays," IEEE Transactions on Computers, vol. 61, No. 12, Dec. 2012, IEEE, New York, New York (eleven pages).

Shafiq et al., "TCAMChecker: A Software Approach to the Error Detection and Correction of TCAM-Based Networking Systems," Journal of Network and Systems Management, vol. 21 Issue 3, Sep. 2013, ACM, New York, New York (eighteen pages).

Rasmussen et al., "TCAM-based High Speed Longest Prefix Matching with Fast Incremental Table Updates," 2013 IEEE 14th International Conference on High Performance Switching and Routing (HPSR), Jul. 2013, IEEE, New York, New York (six pages).

* cited by examiner

COORDINATED UPDATING AND SEARCHING A CONTENT-ADDRESSABLE MEMORY INCLUDING FOR PACKET PROCESSING OPERATIONS

TECHNICAL FIELD

The present disclosure relates generally content-addressable memories, including those used in forwarding packets in a network based on lookup results (e.g., longest prefix matching) in a hardware content-addressable memory (e.g., a binary or ternary content-addressable memory).

BACKGROUND

The communications industry is rapidly changing to adjust to emerging technologies and ever increasing customer demand. This customer demand for new applications and increased performance of existing applications is driving communications network and system providers to employ networks and systems having greater speed and capacity (e.g., greater bandwidth). In trying to achieve these goals, a common approach taken by many communications providers is to use packet switching technology. Content-addressable memories are particularly useful in performing lookup operations in determining how to forward a packet in a network by a packet switching device. However, as routes change in the network, the content-addressable memory needs to be updated accordingly, with these updates decreasing the availability of the content-addressable memory for performing lookup operations.

BRIEF DESCRIPTION OF THE DRAWINGS

The appended claims set forth the features of one or more embodiments with particularity. The embodiment(s), together with its advantages, may be understood from the following detailed description taken in conjunction with the accompanying drawings of which:

DESCRIPTION OF EXAMPLE EMBODIMENTS

1. Overview

Figure 1A:
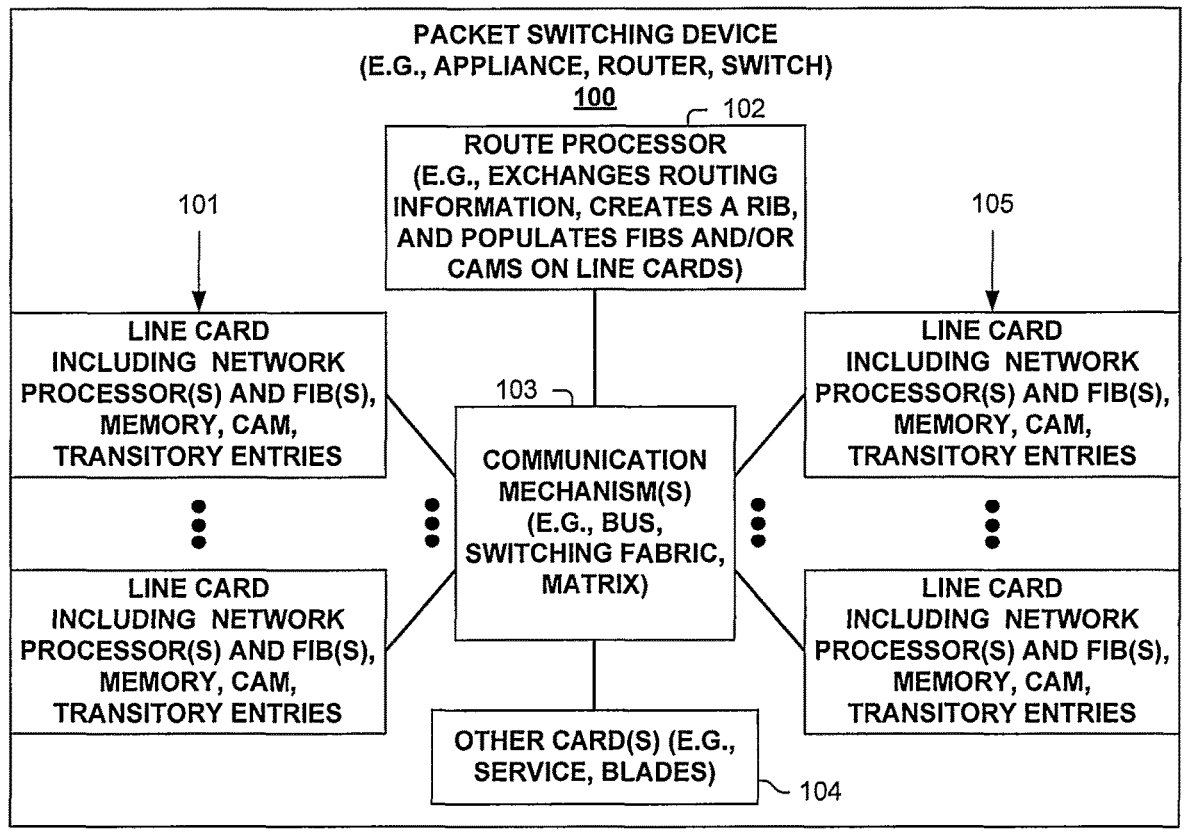
FIG. 1A illustrates a packet switching device including one or more content-addressable memories according to one embodiment.

Disclosed are, inter alia, methods, apparatus, computer-storage media, mechanisms, and means associated with coordinated updating and searching of entries of a hardware content-addressable memory, including, but not limited to, for use in relation to packet processing operations.

One embodiment includes performing a lookup operation in content-addressable memory entries in a hardware content-addressable memory based on a lookup word to generate a content-addressable memory lookup result. Typically overlapping in time, a matching operation is performed in one or more transitory entries to generate a transitory matching result based on the lookup word. These transitory entries are populated with transitory vectors and have an associated index within the content-addressable memory, with these transitory vectors are subsequently inserted in the content-addressable memory at their associated index positions. A matching result is determined from the content-addressable memory lookup result (e.g., no match, index of highest-priority content-addressable memory entry matching the lookup word) and the transitory matching result (e.g., no match, associated index of highest-priority transitory entry matching the lookup word). These transitory entries are subsequently inserted at positions corresponding to their associated index, possibly after a moving of entries within the content-addressable memory to make room for the transitory entries.

In one embodiment, a content-addressable memory direct memory access (DMA) controller performs the moving of the entries, the insertion of the transitory entries into the content-addressable memory, and/or determines the transitory matching result. In one embodiment, a lookup result is retrieved from a database stored in memory based on a position identified by the matching result. In one embodiment, the lookup result includes packet processing information, which is used in the processing of a packet.

2. Description

Disclosed are, inter alia, methods, apparatus, computer-storage media, mechanisms, and means associated with coordinated updating and searching of entries of a hardware content-addressable memory, including, but not limited to, for use in relation to packet processing operations. As used herein, the term "content-addressable memory" ("CAM") refers to a hardware-based content-addressable memory in which vectors stored in valid/enabled multiple content-addressable memory entries are simultaneously compared against corresponding bits of a lookup word. The term "content-addressable memory" ("CAM") includes different implementations, including a binary content-addressable memory (BCAM) and a ternary content-addressable memory (TCAM).

Herein, the programming or value of a content-addressable memory is referred to as a "vector.". "vector." For a BCAM, a vector is typically a data value. For a TCAM, a vector is typically a data value and a mask value, with the mask value defining which bits are to be compared or ignored (e.g., wildcard bits) in a lookup operation. A content-addressable memory may also have a global bit mask register which stores a global masking vector that causes the masking of corresponding bits of each of multiple content-addressable memory entries in a scope of the lookup operation (e.g., all enabled and valid entries in a block of entries). A content-addressable entry matches a lookup word when all non-masked data bits of the vector populated therein match corresponding bits of the lookup word.

Embodiments described herein include various elements and limitations, with no one element or limitation contemplated as being a critical element or limitation. Each of the claims individually recites an aspect of the embodiment in its entirety. Moreover, some embodiments described may include, but are not limited to, inter alia, systems, networks, integrated circuit chips, embedded processors, ASICs, methods, and computer-readable media containing instructions. One or multiple systems, devices, components, etc., may comprise one or more embodiments, which may include some elements or limitations of a claim being performed by the same or different systems, devices, components, etc. A processing element may be a general processor, task-specific processor, a core of one or more processors, or other co-located, resource-sharing implementation for performing the corresponding processing. The embodiments described hereinafter embody various aspects and configurations, with the figures illustrating exemplary and non-limiting configurations. Computer-readable media and means for performing methods and processing block operations (e.g., a processor and memory or other apparatus configured to perform such operations) are disclosed and are in keeping with the extensible scope of the embodiments. The term "apparatus" is used consistently herein with its common definition of an appliance or device.

The steps, connections, and processing of signals and information illustrated in the figures, including, but not limited to, any block and flow diagrams and message sequence charts, may typically be performed in the same or in a different serial or parallel ordering and/or by different components and/or processes, threads, etc., and/or over different connections and be combined with other functions in other embodiments, unless this disables the embodiment or a sequence is explicitly or implicitly required (e.g., for a sequence of read the value, process said read value—the value must be obtained prior to processing it, although some of the associated processing may be performed prior to, concurrently with, and/or after the read operation). Also, nothing described or referenced in this document is admitted as prior art to this application unless explicitly so stated.

The term "one embodiment" is used herein to reference a particular embodiment, wherein each reference to "one embodiment" may refer to a different embodiment, and the use of the term repeatedly herein in describing associated features, elements and/or limitations does not establish a cumulative set of associated features, elements and/or limitations that each and every embodiment must include, although an embodiment typically may include all these features, elements and/or limitations. In addition, the terms "first," "second," etc., are typically used herein to denote different units (e.g., a first element, a second element). The use of these terms herein does not necessarily connote an ordering such as one unit or event occurring or coming before another, but rather provides a mechanism to distinguish between particular units. Moreover, the phrases "based on x" and "in response to x" are used to indicate a minimum set of items "x" from which something is derived or caused, wherein "x" is extensible and does not necessarily describe a complete list of items on which the operation is performed, etc. Additionally, the phrase "coupled to" is used to indicate some level of direct or indirect connection between two elements or devices, with the coupling device or devices modifying or not modifying the coupled signal or communicated information. Moreover, the term "or" is used herein to identify a selection of one or more, including all, of the conjunctive items. Additionally, the transitional term "comprising," which is synonymous with "including," "containing," or "characterized by," is inclusive or open-ended and does not exclude additional, unrecited elements or method steps. Finally, the term "particular machine," when recited in a method claim for performing steps, refers to a particular machine within the 35 USC § 101 machine statutory class.

For a lookup operation using a content-addressable memory when multiple entries can match a lookup word, identification of a single highest-priority matching entry is desired. To provide this identification, typically each entry of a content-addressable memory inherently has a priority associated with it (e.g., based on their position) and a priority encoder (or other mechanism) selects the highest-priority of the entries matching a lookup word for a lookup operation.

Moreover, the order that vectors are stored among content-addressable entries is important. For example, to perform longest prefix matching using a ternary content-addressable memory (TCAM), a longer prefix that can match a particular lookup word is stored in higher-priority TCAM entry than a shorter prefix that can match the particular lookup word. When new vectors are inserted into content-addressable memory entries (e.g., in response to route updates), already stored vector(s) may need to be moved among entries to free an entry so that a vector can be inserted before, in between, or after other programmed vectors to achieve the desired priority ordering. Additionally, storage optimization or other methods may move entries to provide for anticipated future storage operations. However, such movement operations not only reduce the availability of the content-addressable memory, but must be completed before a particular vector can be inserted in the content-addressable memory entry such that the particular vector is part of the search space of the lookup operation.

One embodiment uses transitory entries to store one or more vectors that are to be inserted in the content-addressable memory, with each transitory entry/vector stored therein associated with an insertion point priority. In one embodiment, the insertion point priority is an index (e.g., a value representing an entry of the content-addressable memory) or assigned priority value of the content-addressable memory entry to which the corresponding transitory vector is to be stored. The term "transitory" is used to denote that the vector is temporarily stored in the transitory (e.g., waiting to be inserted, possibly after a move operation within the content-addressable memory to free an entry in which to insert the vector). In one embodiment, a transitory entry is an associative memory entry, including, but not limited to a hardware content-addressable memory entry. In one embodiment, a transitory entry is a register that stores a transitory vector, and a processing element or hardware performs a comparison of the stored transitory vector with the lookup word.

A lookup operation performs, typically simultaneously or overlapping in time, a search on each of the populated (e.g., valid) content-addressable memory entries and also searches each of the transitory entry or entries that is populated with a vector. Thus, the vectors to be inserted immediately become part of the search space without having to wait until actually inserted into the content-addressable memory. A no-match result is a possible content-addressable memory lookup result and/or the transitory lookup result, with a no-match result considered as the lowest possible priority result in one embodiment. The priorities of the content-addressable memory lookup result and the transitory lookup result are compared, with a higher-priority (or not lower-priority) lookup result selected from the results that found a match; else a no-match result is determined by the lookup operation. The lookup result of a matching entry is then typically used in retrieving the lookup result from a database (e.g., stored in an adjunct memory).

Figure 1B:
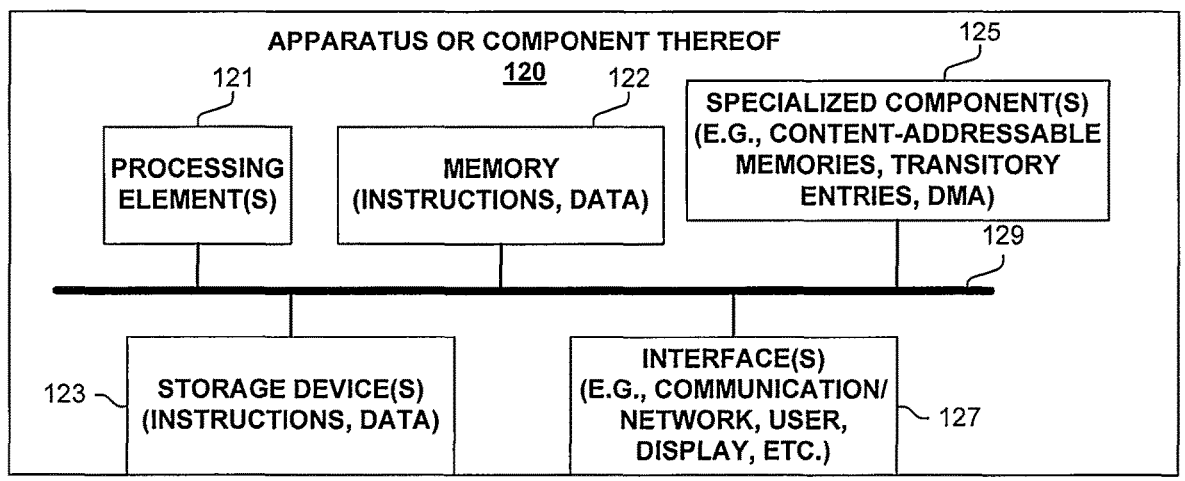
FIG. 1B illustrates an apparatus including one or more content-addressable memories according to one embodiment.

FIGS. 1A-B and their discussion herein are intended to provide a description of various exemplary packet switching systems used according to one embodiment that performs coordinated updating and searching of entries of a hardware content-addressable memory. This coordinated updating includes using transitory entries storing vectors that are searched (along with the content-addressable memory) in a lookup operation, with these vectors subsequently being programmed in entries of the content-addressable memory.

One embodiment of a packet switching device 100 is illustrated in FIG. 1A. As shown, packet switching device 100 includes multiple line cards 101 and 105, each with one or more network interfaces for sending and receiving packets over communications links (e.g., possibly part of a link aggregation group). In one embodiment, apparatus 100 performs one or more processes, or portions thereof, corresponding to one of the flow diagrams illustrated or otherwise described herein, and/or illustrated in another diagram or otherwise described herein.

Line cards 101 and 105 typically include one or more content-addressable memories for performing lookup operations in determining packet processing information, and with one or more processing elements that are used in one embodiment associated with coordinated updating and searching of entries of a hardware content-addressable memory. Packet switching device 100 also has a control plane with one or more processing elements 102 for managing the control plane and/or control plane processing of packets. Packet switching device 100 also includes other cards 104 (e.g., service cards, blades) which include processing elements that are used in one embodiment to process packets (e.g., forward, drop, manipulate, throttle, police, schedule), and some communication mechanism 103 (e.g., bus, switching fabric, and/or matrix, etc.) for allowing its different entities 101, 102, 104 and 105 to communicate.

Line cards 101 and 105 typically perform the actions of being both an ingress and egress line card, in regards to multiple other particular packets and/or packet streams being received by, or sent from, packet switching device 100. In one embodiment, line cards 101 and/or 105 perform content-addressable lookup operations in determining how to ingress and/or egress process packets. Even though the term FIB includes the word "forwarding," this information base typically includes other information describing how to process corresponding packets (e.g., forward, drop, manipulate, throttle, police, schedule).

FIG. 1B is a block diagram of an apparatus 120 used in one embodiment associated with coordinated updating and searching of entries of a hardware content-addressable memory, including, but not limited to, for use in relation to packet processing operations. In one embodiment, apparatus 120 performs one or more processes, or portions thereof, corresponding to one of the flow diagrams illustrated or otherwise described herein, and/or illustrated in another diagram or otherwise described herein.

In one embodiment, apparatus 120 includes one or more processor(s) 121 (typically with on-chip memory), memory 122, storage device(s) 123, specialized component(s) 125 (e.g. optimized hardware, content-addressable memory, transitory entries, content-addressable memory/transitory entries-adjunct memory storing lookup results at corresponding locations), and interface(s) 127 for communicating information (e.g., sending and receiving packets, user-interfaces, displaying information, etc.), which are typically communicatively coupled via one or more communications mechanisms 129 (e.g., bus, links, switching fabric, matrix), with the communications paths typically tailored to meet the needs of a particular application.

Various embodiments of apparatus 120 may include more or fewer elements. The operation of apparatus 120 is typically controlled by processor(s) 121 using memory 122 and storage device(s) 123 to perform one or more tasks or processes. Memory 122 is one type of computer-readable/computer-storage medium, and typically comprises random access memory (RAM), read only memory (ROM), flash memory, integrated circuits, and/or other memory components. Memory 122 typically stores computer-executable instructions to be executed by processor(s) 121 and/or data which is manipulated by processor(s) 121 for implementing functionality in accordance with an embodiment. Storage device(s) 123 are another type of computer-readable medium, and typically comprise solid state storage media, disk drives, diskettes, networked services, tape drives, and other storage devices. Storage device(s) 123 typically store computer-executable instructions to be executed by processor(s) 121 and/or data which is manipulated by processor(s) 121 for implementing functionality in accordance with an embodiment.

Figure 2A:
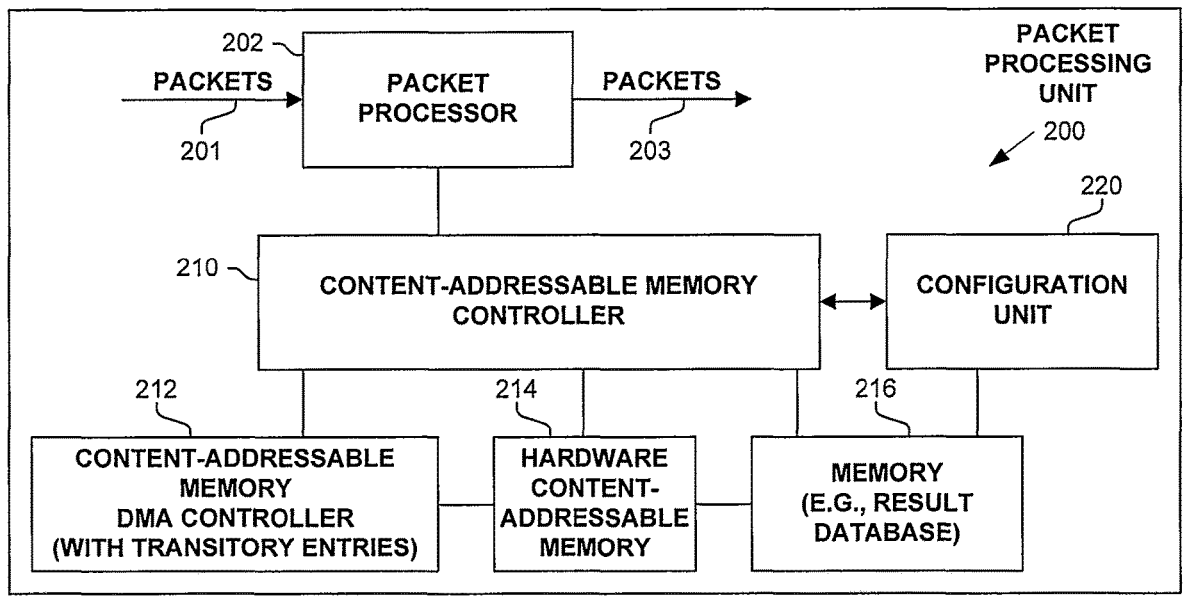
FIG. 2A illustrates an architecture of an apparatus according to one embodiment.

FIG. 2A illustrates a packet processing unit 200 of one embodiment. Packet processor 202 receives and processes packets 201, and forwards non-dropped packets 203. The packet processing for a packet is based on the results of a lookup operation typically based on values extracted from a packet that identifies a stream to which the packet belongs.

Configuration unit 220 maintains one or more result databases in memory 216 (sometimes referred to as adjunct memory to hardware content-addressable memory 214), and provides content-addressable memory controller 210 with instructions for updating hardware content-addressable memory 214. These instructions include, but are not limited to, vectors to populate (also referred to as store, program, insert, etc.) and at what locations in content-addressable memory 214 (and possibly with corresponding results for transitory lookup operations), invalidate (also referred to as delete, remove) specified vectors in content-addressable memory 214, move specified vectors among entries in content-addressable memory 214. Content-addressable memory controller 210 uses content-addressable memory direct memory access (DMA) controller 212 to perform, inter alia, the actual movement of vectors among entries and insertion of vectors in entries of content-addressable memory 214.

In one embodiment, content-addressable memory controller 210 includes one or more transitory entries and memory for storing each associate insertion entry index (e.g., a value representing an entry of content-addressable memory 214) and associated priority if different from the index. In one embodiment, content-addressable memory DMA controller 212 includes one or more transitory entries and memory for storing each associate insertion entry index (e.g., a value representing an entry of content-addressable memory 214) and associated priority if different from the index.

In one embodiment, content-addressable memory controller 210 receives a lookup word from packet processor 202. Content-addressable memory controller 210 provides the lookup word to content-addressable memory 214, which performs a lookup operation thereon and returns a content-addressable memory lookup result, with a matching result then used to retrieve a lookup result from a corresponding database entry of memory 216. Content-addressable memory controller 210 receives the lookup result and provides it to packet processor 202.

In one embodiment, content-addressable memory controller 210 receives a lookup word from packet processor 202. Content-addressable memory controller 210 provides the lookup word to content-addressable memory 214, which performs a lookup operation thereon and returns a content-addressable memory lookup result. Content-addressable memory controller 210 also provides the lookup word to content-addressable memory DMA controller 212, which (typically simultaneously or overlapping in time with the content-addressable memory lookup operations) performs a lookup operation in any populated transitory entry and returns a transitory entry lookup result. Content-addressable memory controller 210 selects the higher-priority of these results (with a no-match being the lowest possible priority). A selected matching result is then used to retrieve a lookup result from a corresponding database entry of memory 216. Content-addressable memory controller 210 receives the lookup result and provides it to packet processor 202.

In one embodiment, content-addressable memory controller 210 receives a lookup word from packet processor 202. Content-addressable memory controller 210 provides the lookup word to content-addressable memory 214, which performs a lookup operation thereon and returns a content-addressable memory lookup result. In response to a move operation in progress, content-addressable memory controller 210 provides the lookup word to content-addressable memory DMA controller 212, which (typically simultaneously or overlapping in time with the content-addressable memory lookup operations) performs a lookup operation in any populated transitory entry and returns a transitory entry lookup result, and the status of a move operation to free up one or more entries for inserting a transitory vector currently populated in a transitory entry. Content-addressable memory controller 210 adjusts the content-addressable memory lookup result as needed to account for the progress of the move operation such that the content-addressable memory lookup result reflects the completed move operation. Content-addressable memory controller 210 selects the higher-priority of these results (with a no-match being the lowest possible priority). A selected matching result is then used to retrieve a lookup result from memory 216 from a corresponding database entry of a database updated to reflect the completed move operation. Content-addressable memory controller 210 receives the lookup result and provides it to packet processor 202.

In one embodiment, content-addressable memory controller 210 receives a lookup word from packet processor 202. Content-addressable memory controller 210 provides the lookup word to content-addressable memory DMA controller 212. Content-addressable memory DMA controller 212 provides the lookup word to content-addressable memory 214, which performs a lookup operation thereon and returns a content-addressable memory lookup result. Content-addressable memory DMA controller 212 (typically simultaneously or overlapping in time with the content-addressable memory lookup operations) performs a lookup operation in any populated transitory entry. Content-addressable memory DMA controller 212 adjusts the content-addressable memory lookup result as needed to account for the progress of the move operation such that the content-addressable memory lookup result reflects the completed move operation. Content-addressable memory DMA controller 212 selects the higher-priority of the adjusted content-addressable memory lookup result and the transitory entry lookup result (with a no-match being the lowest possible priority). A selected matching result is then returned to content-addressable memory controller 210. The selected matching result is then used to retrieve a lookup result from memory 216 from a corresponding database entry of a database updated to reflect the completed move operation. Content-addressable memory controller 210 receives the lookup result and provides it to packet processor 202.

Figure 2B:
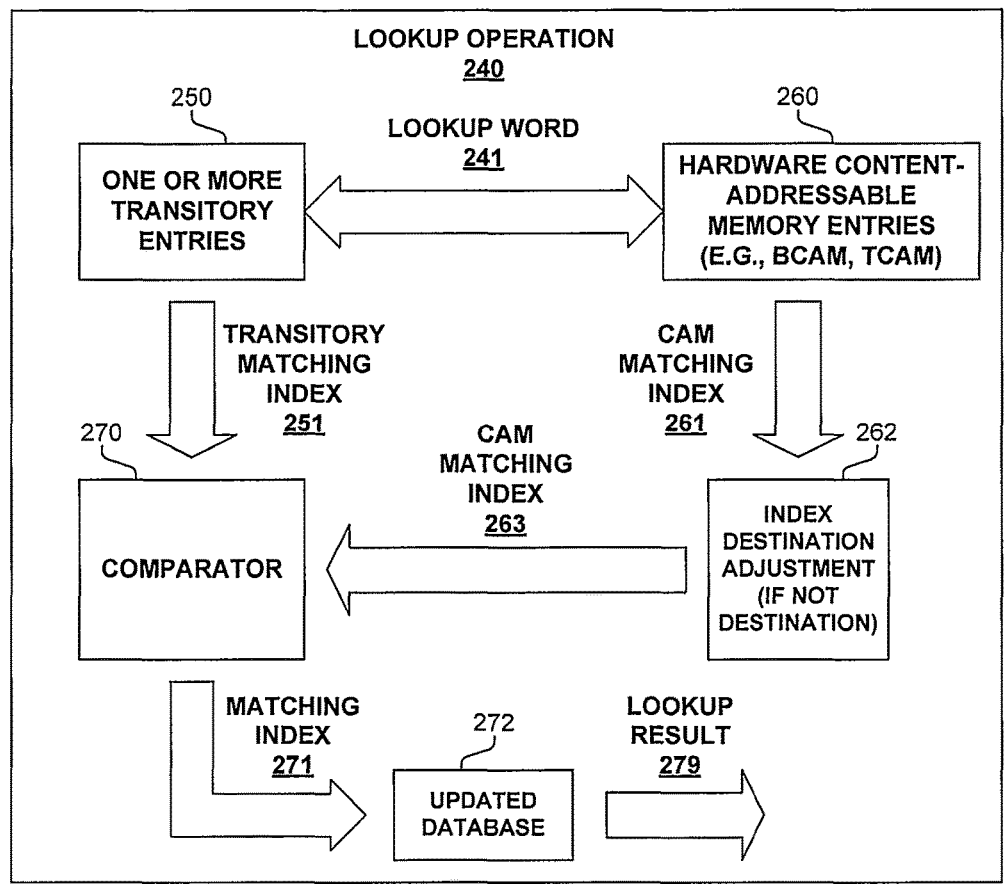
FIG. 2B illustrates a process according to one embodiment.

FIG. 2B illustrates a lookup operation 240 performed according to one embodiment. Lookup word 241 is used to perform (typically simultaneously or at least overlapping in time) lookup operations in one or more transitory entries 250 (which produces transitory matching index 251) and hardware content-addressable memory entries 260 (which produces content-addressable memory matching index 261).

Content-addressable memory matching index 263 is that of content-addressable memory matching index 261, possibly adjusted (262) in light of the progress of a move operation currently underway (e.g., after instructions are provided to a content-addressable memory DMA controller to perform a move operation, with the move operation having not been completed by the time of instituting the lookup operation in the content-addressable memory). This update is necessary in one embodiment as updated database 272 is keyed to indices of content-addressable entries 260 after the designated movement of programmed vectors within content-addressable entries 260 and after insertion of all transitory vector(s) (if any) of one or more transitory entries 250. Also, in one embodiment, transitory matching index 251 reflects an index of the content-addressable entries 260 after the designated movement of programmed vectors within content-addressable entries 260 and after insertion of all transitory vector(s) of one or more transitory entries 250.

Figure 5:
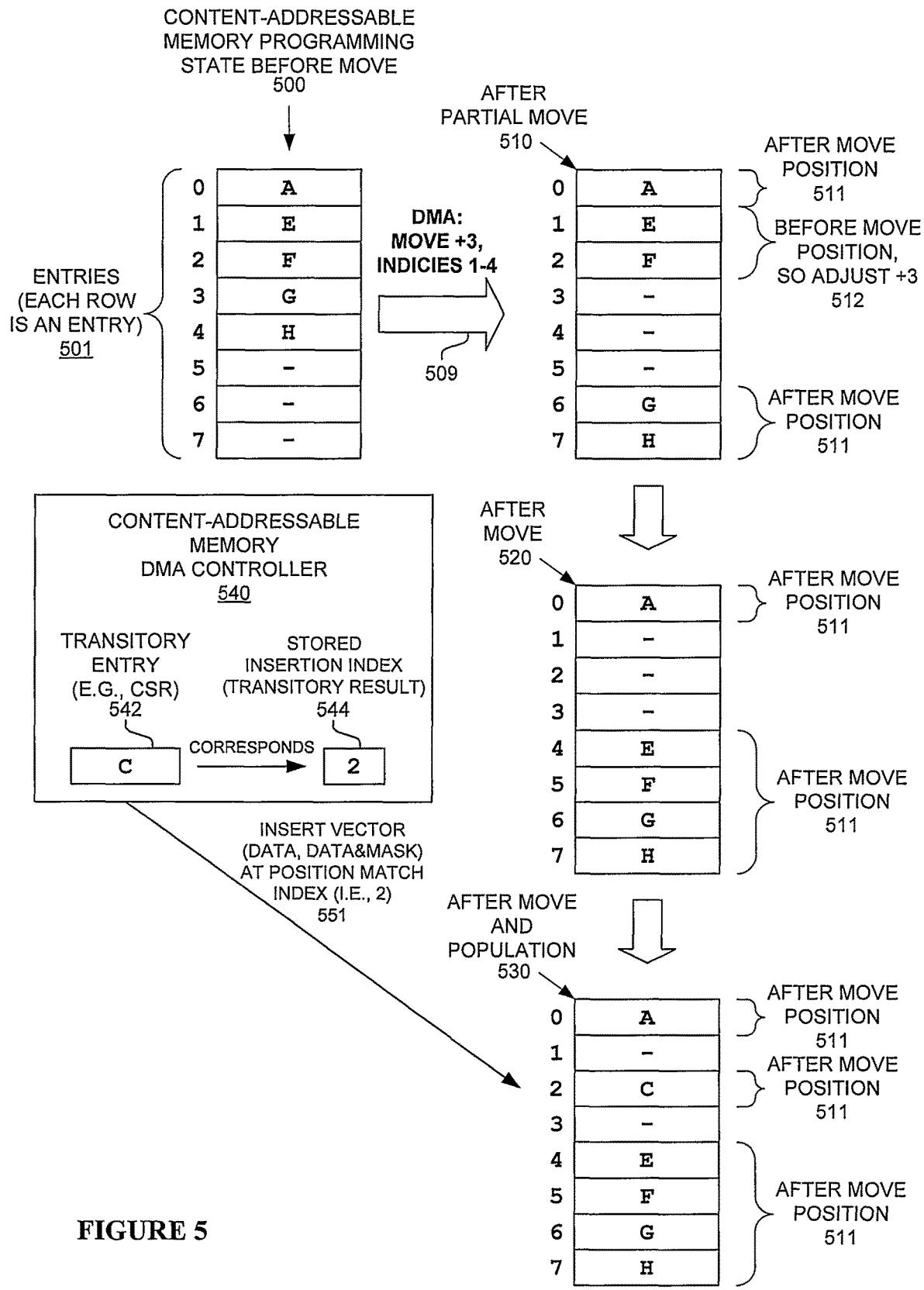
FIG. 5 illustrates a process according to one embodiment.

In one embodiment, if content-addressable memory matching index 261 is that of a source entry with a programmed vector that matched lookup word 241, with that programmed vector designated to be moved to a destination entry, then content-addressable memory matching index 263 is updated to the index of the destination entry. Thus, if content-addressable memory matching index 261 is index s of an entry with its programmed vector to be moved to an entry with an index of d then content-addressable memory matching index 261 is set to d. One embodiment uses a relative distance of p entries for moving programmed vector(s) (e.g., move a programmed vector from an entry with index s to an entry with an index of s+p, where p is a positive or negative integer). The operation of one embodiment is shown in FIG. 5 discussed in detail infra.

Comparator 270 selects as matching index 271 between content-addressable memory matching index 263 and transitory matching index 251 (e.g., a higher or not lower priority index). Matching index 271 is used to retrieve lookup result 279 from database 272, which has been updated to reflect completion of the move operation, if one has been instituted.

Figure 3:
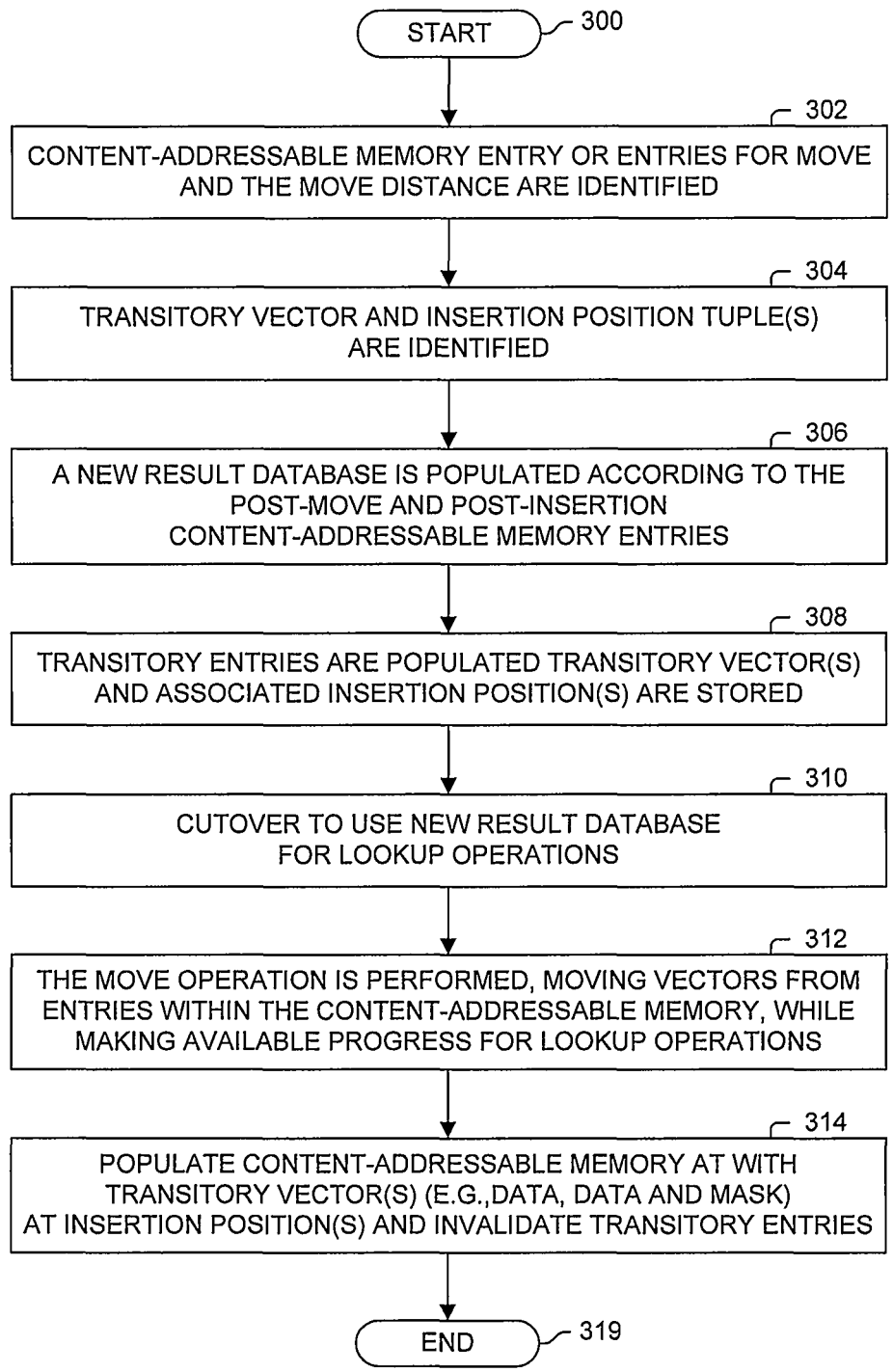
FIG. 3 illustrates a process according to one embodiment.

FIG. 3 illustrates a process performed according to one embodiment that coordinates updating and searching of entries of a hardware content-addressable memory. Processing begins with process block 300. In process block 302, one or more content-addressable memory entries are identified from which their programmed vectors are to be moved and the distance to be moved (e.g., how many entry positions and in which direction). In process block 304, one or more tuples of a transitory vector and its insertion position (e.g., index) are identified to be added to the content-addressable memory after the move operation is completed. In process block 306, a new result database is populated according to the post-move and post-insertion content-addressable memory entries. In process block 308, one or more transitory entries are populated with the transitory vectors with their insertion position(s) stored. In process block 310, a cutover is made to use the new result database for lookup operations. In process block 312, the move operation is performed moving vectors from entries within the content-addressable memory, with the status of the move operation being made available for lookup operations. In process block 314, the transitory vector(s) are programmed in their respective entries of the content-addressable memory and the corresponding transitory entry or entries are invalidated.

In one embodiment, the transitory vector(s) are not inserted until after the move operation is completed. In one embodiment, a transitory vector is inserted before a move operation is completed, but after the insertion position is no longer occupied. Processing of the flow diagram of FIG. 3 is complete as indicated by process block 319.

Figure 4:
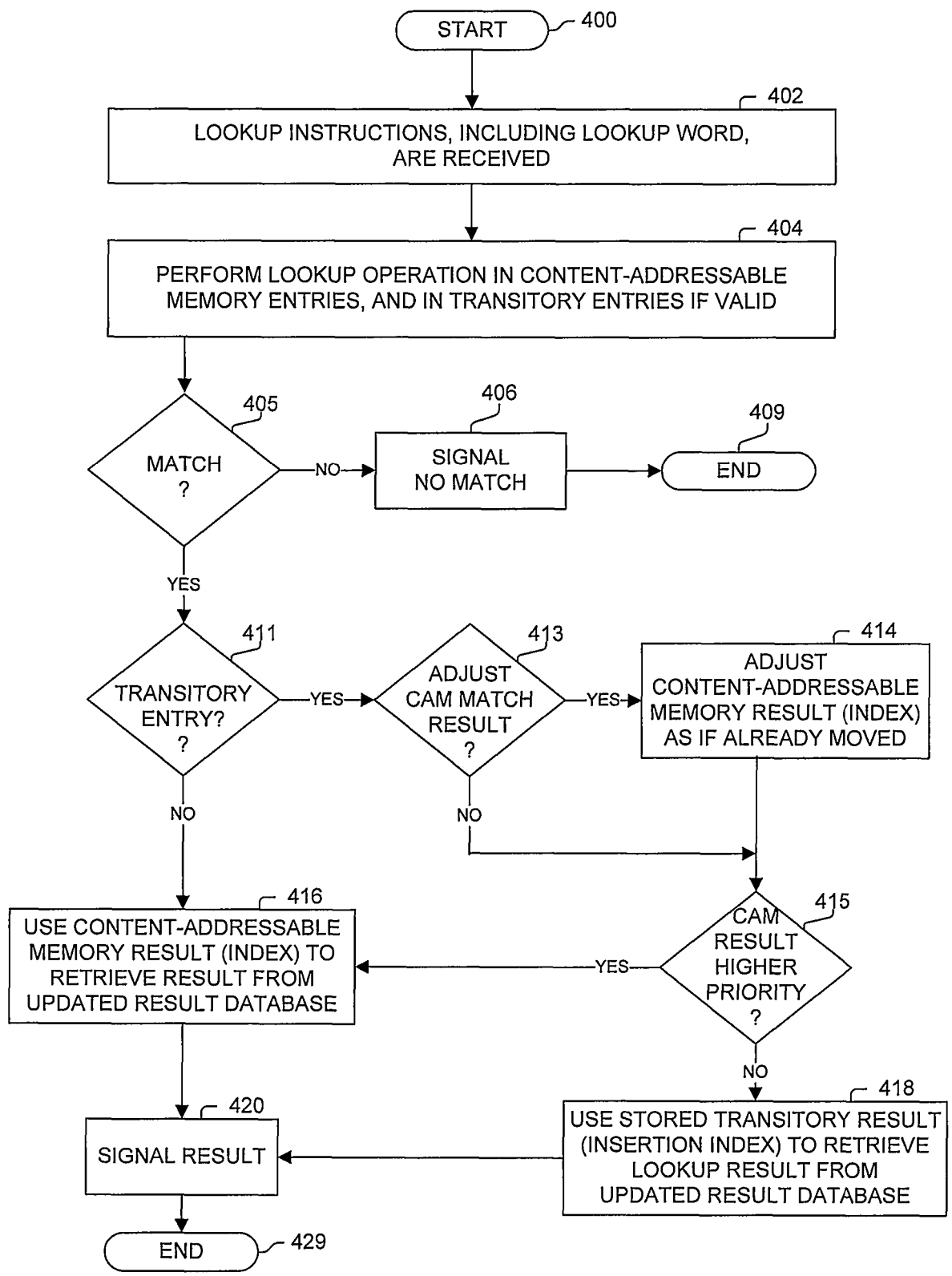
FIG. 4 illustrates a process according to one embodiment.

FIG. 4 illustrates a process performed according to one embodiment. Processing begins with process block 400. In process block 402, a lookup instruction is received, including the lookup word (and possibly other values such as an identification of a lookup profile or block mask). In process block 404, the lookup operation based on the lookup word (and possibly other values in the instruction) is performed in the content-addressable memory and in any transitory entries that are valid/enabled (e.g., that are populated with a transitory vector).

As determined in process block 405, if one or both of these lookup operations identified a matching entry, then processing proceeds to process block 411; otherwise a no match signal is provided in process block 406, and processing of the flow diagram of FIG. 4 is complete as indicated by process block 409.

Continuing with, and as determined in process block 411, if there is one or more valid/enabled transitory entries, then processing proceeds to process block 413; otherwise processing proceeds to process block 416.

Continuing with, and as determined in process block 413, if the content-addressable memory lookup result needs to be adjusted based on the progress of the move operation (e.g., it reflects an index of an entry to be, but not yet moved), then processing proceeds to process block 414; otherwise processing proceeds directly to process block 415.

Continuing with process block 414, the content-addressable memory lookup result is adjusted from the matching entries source position (before the move) to its destination position (after the move). Processing proceeds to process block 415.

Continuing with, and as determined in process block 415, if the content-addressable memory lookup result (possibly adjusted) has a higher-priority than that of the transitory entry lookup result, then processing proceeds to process block 416; otherwise processing proceeds to process block 418.

Continuing with process block 416, the content-addressable memory lookup result is used to retrieve the lookup result from the new result database. Processing proceeds to process block 420.

Continuing with process block 418, the transitory result is used to retrieve the lookup result from the new result database. Processing proceeds to process block 420.

Continuing with process block 420, the lookup result is signaled (e.g., provide to a packet processor or other device or process). Processing of the flow diagram of FIG. 4 is complete as indicated by process block 429.

FIG. 5. illustrates a process performed according to one embodiment. This illustration includes a content-addressable memory (with eight entries 501, indices ranging from zero to seven) and one transitory entry 542.

The initial programmed state (500) of the content-addressable memory is illustrated with entries zero to four corresponding populated with the five vectors (e.g., data for a BCAM; data/mask for a TCAM) of A, E, F, G and H.

Transitory entry 542 is initially populated with vector of C. Additionally, transitory result/insertion index storage 544 (corresponding to transitory entry 542) is initially populated with an index value of two (which is both the insertion entry and the transitory lookup value used if a lookup word matches transitory entry 542). In one embodiment, content-addressable memory DMA controller 540 includes transitory entry 542 and insertion index storage 544. In one embodiment, content-addressable memory DMA controller 540 performs the movement of vectors among entries of the content-addressable memory by reading the vector from a source entry and writing the read vector to a destination entry.

Content-addressable memory DMA controller 540 begins the move operation of instruction 509, which defines to move vectors from each source entry having an index ranging from one to four to a destination entry with an index of three greater than the source index. A negative move value results in a movement of vectors from an entry with a source index to an entry with a destination index that is less than the source index.

The programmed state (510) of the content-addressable memory after two of the vectors have been moved is illustrated with entries zero to seven corresponding populated with the five vectors as shown. Entries with an index of zero (vector A), six (vector G), and seven (vector H) are programmed with the vectors they would have after the move operation is completed (marked by "after move position 511" in FIG. 5). Therefore, in response to a lookup operation performed on the content-addressable memory having programmed state (510), a resulting lookup result of index zero (A), six (G), or seven (H) would not need to be adjusted. However, in response to a lookup operation performed on the content-addressable memory having programmed state (510), a resulting lookup result of index one (E) or two (F) would need to be adjusted (512) by a value of positive three. Entries three, four, and five are not valid/not enabled so they do not participate in the lookup operation.

It is also possible that during the move operation, a vector may be programmed in two entries (e.g., the source and destination entries). For example, entry three of programmed state 510 could also still be populated with a value of G, with entry three being considered valid/enabled and participates in the lookup operation. In this situation and with the content-addressable memory lookup result being entry three (G), then the content-addressable memory lookup result would be adjusted by positive three to a value of six (the post-move position of vector G).

The programmed state (520) of the content-addressable memory after all of the vectors have been moved is illustrated with entries zero to seven corresponding populated with the five vectors as shown, each of which being marked as "after move position 511" in FIG. 5.

For a lookup operation during the move operation that matched transitory entry 542 having a populated vector of C, the transitory lookup result (value of two) would be retrieved from stored insertion index 544.

After the move is completed, each transitory entry (542) is inserted (551) into the content-addressable memory at its corresponding stored insertion position (544). The programmed state (530) of the content-addressable memory after all of the vectors have been moved and all transitory vectors inserted is illustrated with entries zero to seven correspondingly populated with the six vectors as shown, each of which being marked as "after move position 511" in FIG. 5). In one embodiment, each transitory entry (542) is then invalidated/disabled so it will not participate in a future search until reprogrammed and marked valid/enabled.

In view of the many possible embodiments to which the principles of the disclosure may be applied, it will be appreciated that the embodiments and aspects thereof described herein with respect to the drawings/figures are only illustrative and should not be taken as limiting the scope of the disclosure. For example, and as would be apparent to one skilled in the art, many of the process block operations can be re-ordered to be performed before, after, or substantially concurrent with other operations. Also, many different forms of data structures could be used in various embodiments. The disclosure as described herein contemplates all such embodiments as may come within the scope of the following claims and equivalents thereof.

What is claimed is:

1. A method, comprising:
   determining a matching result of a matching search of a lookup word in a search space comprising a plurality of content-addressable memory entries and one or more transitory entries, wherein said determining the matching result includes:
   performing a lookup operation in the plurality of content-addressable memory entries in a hardware content-addressable memory based on the lookup word to generate a content-addressable memory lookup result including an index position of a matching content-addressable memory entry within the hardware content-addressable memory, wherein a respective index position of each of the plurality of content-addressable memory entries within the hardware content-addressable memory defines its search result priority;
   performing a matching operation in said one or more transitory entries to generate a transitory matching result based on the lookup word, with each of said transitory entries having an associated insertion position in the hardware content-addressable memory, wherein the transitory matching result identifies a particular insertion position; and
   determining the matching result based on the index position of the matching content-addressable memory entry included in the content-addressable memory lookup result and the particular insertion position of the transitory matching result; and
   wherein the method further includes subsequently to said determining the matching result: moving one or more of the content-addressable memory entries to a different index position within the hardware content-addressable memory to make available each particular said associated insertion position of said one or more transitory entries, and for each particular transitory entry of said transitory entries, populating an entry of the plurality of content-addressable memory entries at said associated insertion position of said particular transitory entry with said particular transitory entry;
   wherein the term hardware "content-addressable memory" ("CAM") refers to a hardware-based content-addressable memory in which all non-masked bit position values of each valid/enabled entry of a particular plurality of content-addressable memory entries are simultaneously compared against corresponding bits of a plurality of bits of a particular lookup word in identifying which of the particular plurality of content-addressable memory entries match the particular lookup word.

2. The method of claim 1, comprising:
   retrieving a lookup result based on the matching result from a result database; and
   processing a packet based on the lookup result.

3. The method of claim 2, wherein the matching result is the associated insertion position of said transitory entry identified by the transitory matching result.

4. The method of claim 1, comprising determining a lookup result based on the matching result from a result database.

5. The method of claim 1, wherein said performing the lookup operation and performing the matching operation are performed overlapping in time.

6. The method of claim 1, wherein a content-addressable memory direct memory access (DMA) controller includes said one or more transitory entries; and wherein the content-addressable memory DMA controller said performs the matching operation.

7. The method of claim 6, wherein said one or more transitory entries is a single transitory entry.

8. The method of claim 7, wherein a control status register of the DMA controller includes the transitory entry; and wherein the DMA controller includes memory storing the transitory matching result.

9. The method of claim 1, wherein the hardware content-addressable memory is a ternary content-addressable memory.

10. A method, comprising:
    determining a lookup result of a matching search of a lookup word in a search space comprising a plurality of content-addressable memory entries and a transitory entry, wherein said determining the lookup result includes:
    performing a lookup operation in the plurality of content-addressable memory entries in a hardware content-addressable memory based on the lookup word to generate a content-addressable memory lookup result identifying a source entry position of a matching entry of the plurality of content-addressable memory entries within the hardware content-addressable memory, wherein a respective index position of each of the plurality of content-addressable memory entries within the hardware content-addressable memory defines its search result priority; and adjusting the content-addressable memory lookup result from the source entry position to a destination entry position within the plurality of content-addressable memory entries to which the matching entry is to be moved to make available the source entry position of the plurality of content-addressable memory entries to store the transitory entry after the lookup result is determined;
    performing a matching operation on the transitory entry to generate a transitory matching result based on the lookup word matching the transitory entry, wherein the transitory matching result identifies the source entry position; and
    after said adjusting the content-addressable memory lookup result, determining the lookup result to be the content-addressable memory lookup result based on the destination entry position of the content addressable memory lookup result being a higher-priority position within the plurality of content-addressable memory entries than the source entry position identified by the transitory matching result; and
    wherein the method further includes: after said determining the lookup result, moving the matching entry from the source entry position to the destination entry position within the plurality of content-addressable memory entries and then populating the content-addressable memory entry at the source entry position of the plurality of content-addressable memory entries with the transitory entry;
    wherein the term hardware "content-addressable memory" ("CAM") refers to a hardware-based content-addressable memory in which all non-masked bit position values of each valid/enabled entry of a particular plurality of content-addressable memory entries are simultaneously compared against corresponding bits of a plurality of bits of a particular lookup word in identifying which of the particular plurality of content-addressable memory entries match the particular lookup word.

\* \* \* \* \*